(12) United States Patent
Vidojkovic et al.

(10) Patent No.: US 8,971,831 B2
(45) Date of Patent: Mar. 3, 2015

(54) FRONT-END SYSTEM FOR RADIO DEVICES

(71) Applicant: IMEC, Leuven (BE)

(72) Inventors: Vojkan Vidojkovic, Leuven (BE); Kristof Vaesen, Leuven (BE); Piet Wambacq, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/768,148

(22) Filed: Feb. 15, 2013

(65) Prior Publication Data
US 2013/0214863 A1 Aug. 22, 2013

(30) Foreign Application Priority Data
Feb. 17, 2012 (EP) .................................... 12156098

(51) Int. Cl.
*H04B 1/06* (2006.01)
*H03F 1/38* (2006.01)
(Continued)

(52) U.S. Cl.
CPC .............. *H03F 3/45071* (2013.01); *H04B 1/30* (2013.01); *H03F 2200/541* (2013.01);
(Continued)

(58) Field of Classification Search
CPC ..................... H03F 2200/294; H03F 2200/534; H03F 2200/541; H03F 2200/141; H03F 2200/144; H03F 3/45071
USPC ............................ 455/326, 232.1, 245.1, 280
See application file for complete search history.

(56) References Cited

U.S. PATENT DOCUMENTS 2,102,401 A * 12/1937 Yolles ........................... 455/285
6,147,589 A * 11/2000 Ohmura ...................... 338/22 R
(Continued)

FOREIGN PATENT DOCUMENTS

WO 00/02323 1/2000
WO WO0152431 A1 7/2001
(Continued)

OTHER PUBLICATIONS

Borremans, Jonathan et al., "A Digitally Controlled Compact 57-to-66GHz Front-End in 45nm Digital CMOS", ISSCC 2009/Session 29/mm-Wave Circuits/29.5, 2009 IEEE International Solid-State Circuits Conference, Feb. 2009, pp. 492-493 and Figure.
(Continued)

*Primary Examiner* — Duc M Nguyen
(74) *Attorney, Agent, or Firm* — McDonnell Boehnen Hulbert & Berghoff LLP

(57) ABSTRACT

The present disclosure relates to a front-end system for a radio device, the front-end system comprising a low-noise amplifier (LNA), arranged for receiving a radio frequency input signal ($RF_{IN}$) and arranged for outputting an amplified radio frequency signal ($RF_{OUT}$), wherein the low-noise amplifier comprises a first differential amplifier, and a mixer (MIX), arranged for down-converting the amplified radio signal ($RF_{OUT}$) provided by the low-noise amplifier (LNA) to a baseband signal (BB), by multiplying the amplified radio signal ($RF_{OUT}$) with a local oscillator (LO) frequency tone, said low-noise amplifier (LNA) and said mixer (MIX) being inductively coupled.

18 Claims, 6 Drawing Sheets

(51) Int. Cl.
*H03F 3/45* (2006.01)
*H04B 1/30* (2006.01)

(52) U.S. Cl.
CPC .... *H03F 2200/144* (2013.01); *H03F 2200/141* (2013.01); *H03F 2200/537* (2013.01); *H03F 2200/534* (2013.01); *H03F 2200/294* (2013.01)
USPC ............. 455/232.1; 455/245.1; 455/326; 455/280; 330/291; 330/294; 330/109

(56) References Cited

U.S. PATENT DOCUMENTS

| | | | |
|---|---|---|---|
| 6,646,508 B1* | 11/2003 | Barbetta | 330/264 |
| 6,809,581 B2* | 10/2004 | Rofougaran et al. | 327/563 |
| 7,355,479 B2* | 4/2008 | Van Der Heijden | 330/292 |
| 7,489,192 B2* | 2/2009 | Vitzilaios et al. | 330/79 |
| 7,688,146 B2* | 3/2010 | Kao et al. | 330/301 |
| 8,208,887 B2* | 6/2012 | Lee et al. | 455/292 |
| 8,571,511 B2* | 10/2013 | Goldfarb | 455/323 |
| 2003/0114129 A1 | 6/2003 | Jerng | |
| 2003/0130006 A1* | 7/2003 | Reynolds | 455/550 |
| 2004/0219900 A1* | 11/2004 | Zheng et al. | 455/302 |
| 2005/0057304 A1* | 3/2005 | Gilbert et al. | 330/254 |
| 2005/0140440 A1 | 6/2005 | Ten Dolle et al. | |
| 2006/0164171 A1* | 7/2006 | Wu | 330/301 |
| 2007/0046376 A1 | 3/2007 | Van Der Heijden | |
| 2008/0048785 A1* | 2/2008 | Mokhtar et al. | 330/311 |
| 2008/0139149 A1 | 6/2008 | Mu et al. | |
| 2009/0108937 A1* | 4/2009 | Yamaguchi | 330/260 |
| 2009/0115522 A1* | 5/2009 | Lyden et al. | 330/258 |
| 2011/0081879 A1* | 4/2011 | Sato | 455/280 |
| 2013/0281043 A1* | 10/2013 | Mu | 455/311 |
| 2013/0300503 A1* | 11/2013 | Hebert | 330/254 |

FOREIGN PATENT DOCUMENTS

| | | |
|---|---|---|
| WO | WO2007/068547 A1 | 6/2007 |
| WO | WO2009/035665 A1 | 3/2009 |

OTHER PUBLICATIONS

Khanpour, Mehdi et al., "A Wideband W-Band Receiver Front-End in 65-nm CMOS", IEEE Journal of Solid-State Circuits, vol. 43, No. 8, Aug. 2008, pp. 1717-1730.

Weyers, Christopher et al., "A 22.3dB Voltage Gain 6.1dB NF 60GHz LNA in 65nm CMOS With Differential Output", ISSCC 2008/Session 9/mm-Wave and Phased Arrays/9.7, 2008 IEEE International Solid-State Circuits Conference, Feb. 2008, pp. 192-193 and Figure.

European Search Report, European Patent Application No. 13154751.5, dated Oct. 15, 2013.

European Search Report, European Patent Application No. 12156098.1 dated May 7, 2012.

Kim, Ki-Jin et al., "A Design Methodology for the 60 GHz CMOS Power Amplifier Using On-Chip Transformers", Microwave and Optical Technology Letters, vol. 53, No. 3, Mar. 2011, pp. 506-509.

Wooten, Tyson S. et al., "A Decade Bandwidth, Low Voltage, Medium Power Class B Push-Pull Si/SiGe HBT Power Amplifier Employing Through-Wafer Vias", 2008 IEEE Radio Frequency Integrated Circuits Symposium, Jul. 2008, pp. 519-522.

Vidojkovic, Maja et al., "A 1.2 V, Inductorless, Broadband LNA in 90 nm CMOS LP", 2007 IEEE Radio Frequency Integrated Circuits Symposium, Jun. 2007, pp. 53-56.

Interstil, "Wideband, Low-Power, Ultra-High Dynamic Range Differential Amplifier", Technical Brochure Mar. 2, 2011, pp. 1-18.

Ku, Bon-Hyun et al., "A Wideband Transformer-Coupled CMOS Power Amplifier for X-Band Multifunction Chips", IEEE Transactions on Microwave Theory and Techniques, Jun. 2011, pp. 1-11.

Chan, Wei L. et al., "A 58-65 GHz Neutralized CMOS Power Amplifier With PAE Above 10% at 1-V Supply", IEEE Journal of Solid-State Circuits, Vo. 45, No. 3, Mar. 2010, pp. 554-564.

Chan, Wei L. et al., "A 60GHz Band 1V 11.5dBm Power Amplifier With 11% PAE in 65nm CMOS", ISSCC 2009/Session 22/PA and Antenna Interface/22.4, 2009 IEEE International Solid-State Circuits Conference, Feb. 2009, pp. 380-382.

\* cited by examiner

FRONT-END SYSTEM FOR RADIO DEVICES

CROSS-REFERENCE TO RELATED APPLICATION

This application claims priority to European Patent Application No. 12156098.1 filed on Feb. 17, 2012, the contents of which are hereby incorporated by reference.

FIELD OF THE INVENTION

The present disclosure relates to a front-end system for wireless devices and more specifically for wireless devices for mm-wave applications.

BACKGROUND OF THE INVENTION

For wireless communication at data rates above about 1 Gbit/s, a frequency band of about 7 GHz has been allocated around about 60 GHz. In this frequency band several applications are targeted with mass-market potential. For example wireless High Definition Multi-media Interface (HDMI), wireless Universal Serial Bus (USB) or SYNC-and-GO, allowing fast data download, are very interesting application for the consumer market. For wireless consumer products, the key elements are low price and low power consumption. Considering possible implementation technology, CMOS is preferred as it allows for integration of both digital and analog blocks on a single chip. Moreover, downscaled digital CMOS—a cheap technology for large-volume products—is capable of handling radio frequency signals with a carrier frequency of about 60 GHz and with baseband bandwidths up to about 1 GHz. To relax the link budget (i.e. the gain and the output power of the transmitter), often beam-forming, which requires multiple antenna paths at the receiver and the transmitter sides, is used. Compact designs occupying small chip area and consuming low power are essential for beam-forming transceivers operating at about 60 GHz.

For a radio receiver operating at millimeter-waves the most challenging tasks are the design and implementation of the blocks operating directly at the radio frequency, i.e. so called radio frequency (RF) building blocks. A simplified block scheme of a wireless receiver operating at millimeter-waves is shown in FIG. 1. The LNA and the down-conversion mixers (MIX) form the RF front-end, and they amplify and down-convert the received RF signal to low (baseband) frequencies. The signal is further processed by the baseband (BB) blocks.

The design challenge comes from the fact that the RF front-end (i.e. the LNA and MIX blocks) are tuned circuits, which intensively use inductive passive elements (inductors or transformers) to tune out/cancel parasitic capacitances. As a consequence different resonant circuits are created in the front-end. Accurate prediction of the resonant frequencies and mutual dependence of these resonant circuits have direct influence on performance of RF building blocks. In addition, since the RF building blocks operate directly at mm-wave frequencies, they represent the most power hungry part of a radio receiver as well as the strongest noise contributor.

Different radio receiver architectures operating at millimeter-waves have been proposed. However, they primarily focus on proposing optimal designs for only one of the RF front-end blocks, e.g. the LNA block. For example, Borremans et al. ("*A digitally controlled compact 57-to-66 GHz front-end in 45 nm digital CMOS*", IEEE ISSCC 2009, pp. 492-493, 493a, February 2009) propose a 60 GHz low noise direct-downconversion front-end with a two-stage cascode LNA and a conventional current-commutating down-conversion mixer (so called Gilbert-type mixer). Khanpour et al. propose in "*A Wideband W-Band Receiver Front-End in 65-nm CMOS*" (IEEE ISSCC 2008, vol. 43, no. 8, pp. 1717-1730, August 2008) a wideband front-end with a three-stage cascode LNA with transformer feedback and double-balanced Gilbert-cell mixers. Weyers et al. ("*A 22.3 dB Voltage Gain 6.1 dB NF 60 GHz LNA in 65 nm CMOS with Differential Output*", IEEE ISSCC 2008, pp. 192-606, February 2008) propose a LNA with two inductively-coupled cascode amplifiers and an output buffer, which can be directly connected to double-balanced Gilbert-cell mixers. However, there are a couple of problems associated with the proposed solutions. First, the layout is bulky because they use several inductors per stage. This increases the sensitivity to parasitics and modeling inaccuracies. Second, the ESD protection, which is made by using diodes, introduces penalty to the noise figure. It is difficult to achieve noise figure lower than 7 dB using proposed solutions. Further, these conventional architectures suffer from high current losses as they use current-commutating mixer.

Document WO01/52431 presents a receiver RF front-end with two-step down-conversion. The application is mainly concerned with the issues typical for two-step down-conversion front-ends. For example, it explains how the image can be rejected by the LNA before first down-conversion.

In WO2009/035665, a low-noise amplifier suitable for operation at low-frequencies is presented. It is fully based on feedback and it cannot be at all used at 60 GHz. The presented feedback configurations simply cannot be used at 60 GHz because the active element (amplifier) cannot provide sufficient gain.

Application WO2007/068547 deals with a frequency division multiplex system for wireless communications. In this system the receiver and the transmitter are both on and the strong transmit signal is a strong interferer for the weak received signal. One mainly focuses on the way the receiver can suppress the strong signal coming from the transmitter.

It becomes apparent that there is a need for providing a low power, cost and area efficient front-end solution for wireless devices operating at mm-waves.

SUMMARY OF THE INVENTION

The present disclosure aims at providing a low power, cost and area effective front-end system for wireless devices operating at mm-waves.

In one aspect, the present disclosure relates a front-end system for a radio device, the front-end system comprising:
  a low-noise amplifier arranged for receiving a radio frequency input signal and arranged for outputting an amplified radio frequency signal, and
  a mixer arranged for down-converting the amplified radio frequency signal provided by the low-noise amplifier to a baseband signal by multiplying the amplified radio frequency signal with a local oscillator frequency tone.
The low-noise amplifier and the mixer are transformer-coupled.

In a one embodiment, the low-noise amplifier is provided with a neutralization circuit comprising a cross-coupled capacitor.

In another embodiment, the low-noise amplifier is further provided with a resistive shunt feedback circuit.

In another embodiment, the low-noise amplifier comprises a first amplification stage and a second amplification stage, wherein the second amplification stage further amplifies the input signal. The second amplification stage is advantageously inductively coupled to the first amplification stage, perhaps via a transformer.

In another embodiment, the first amplification stage comprises a resistive shunt feedback circuit, whereby the resistive shunt feedback circuit further comprises a capacitor connected in series to a resistor, for DC decoupling the low-noise amplifier. The simultaneous use of neutralization circuit and a resistive shunt feedback circuit with capacitor helps achieving simultaneously low noise figure, good impedance match and improved stability of the low-noise amplifier.

In another embodiment, the low-noise amplifier is inductively coupled to an antenna.

In another embodiment, the front-end system comprises at the input of the low noise amplifier an input transformer with a coupling value k of 0.5 and a turn-ratio of 1:3.

In another embodiment, the mixer is a passive voltage-commutating mixer. The mixer is preferably implemented differentially.

The proposed RF front-end system as described above can be readily embedded in radio device operating at millimeter-waves.

BRIEF DESCRIPTION OF THE DRAWINGS

For a better understanding of the present disclosure preferred embodiments are described below in conjunction with the appended figures and figures description, wherein.

DETAILED DESCRIPTION

Figure 1:
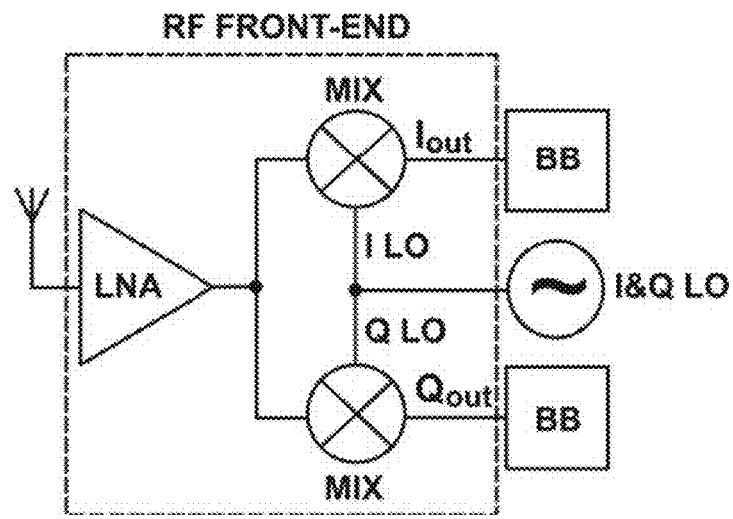
FIG. 1 illustrates a block diagram of an RF front-end system.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

As described above, the first building block of the RF front-end is the low-noise amplifier LNA, which is directly connected to the antenna. As being the first block, the LNA has to fulfill a number of important tasks. First, it has to provide high amplification of the received RF signal while adding as less noise as possible. Second, it has to provide good impedance match to prevent reflection of the received signal and formation of a standing wave, i.e. its input impedance has to match the impedance of the antenna. Third, it has to ensure good trade-off between noise and impedance match, to simultaneously provide low noise and good impedance match. However, all three requirements (high gain, low noise figure and good input impedance match) depend on the same design parameters. Their mutual dependence makes the RF front-end design very challenging.

Figure 2:
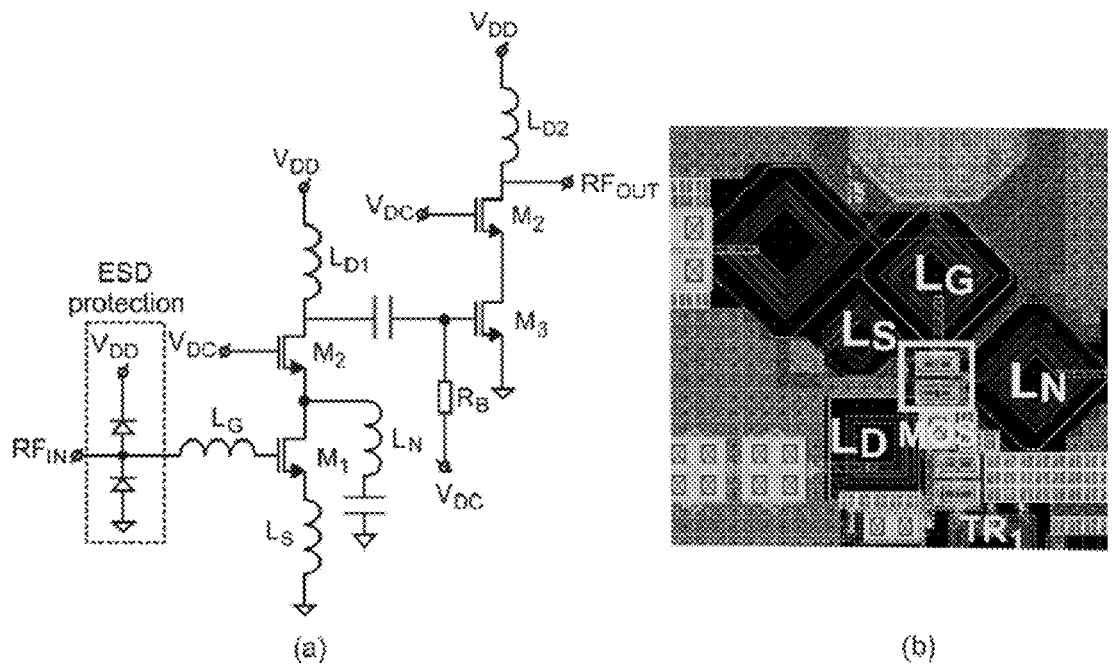
FIG. 2 illustrates an example of a schematic and a possible layout of an inductively-degenerated common-source low noise amplifier.

To illustrate the problem of intensive use of inductors as well as the mutual dependence on the LNA performance parameters (gain, noise figure and input impedance), an inductively-degenerated common-source LNA (see the above-mentioned Borremans paper) is taken as an example. This LNA topology represents a conventional LNA design for 60 GHz applications. The schematic and a possible layout of the inductively-degenerated common-source LNA are shown in FIG. 2(a) and FIG. 2(b), respectively. This design comprises five inductive elements having the following functionality:

1) $L_S$ is used to control the real part of the input impedance;
2) $L_G$ is used to cancel the input capacitance of the transistor M1;
3) $L_N$ improves the output impedance of the transistor M1 and to reduce the noise contribution of the cascode MOS transistor M2;
4) $L_{D1}$ tunes the capacitance at the output of the first stage in the LNA; and
5) $L_{D2}$ tunes the capacitance at the output of the first stage in the LNA.

Here, the input impedance of the LNA depends on the inductors $L_S$ and $L_G$, as well as on the transconductance and the input capacitance of the transistor M1. At the same time, these parameters influence the gain as well as the noise figure of the LNA.

Performing the design and implementation of the LNA with the right balance between different LNA performance, i.e. impedance match, gain and noise figure is very challenging. In addition, accurate prediction of the inductors behaviour is required. The intensive use of inductive passive elements (inductors or transformers) to tune out/cancel parasitic capacitances in conventional approaches results in creating tuned circuits, of which the behaviour should be accurately predicted by taking into account their mutual influence via magnetic field. Also, at about 60 GHz the interconnects play an important role and must be taken into account. FIG. 2(b) illustrates the layout of such an LNA showing closely positioned inductive elements, which results in high mutual dependence and significantly deteriorates the LNA robustness to process spread. The possibility to recover from a bad process corner is reduced as well.

Figure 3:
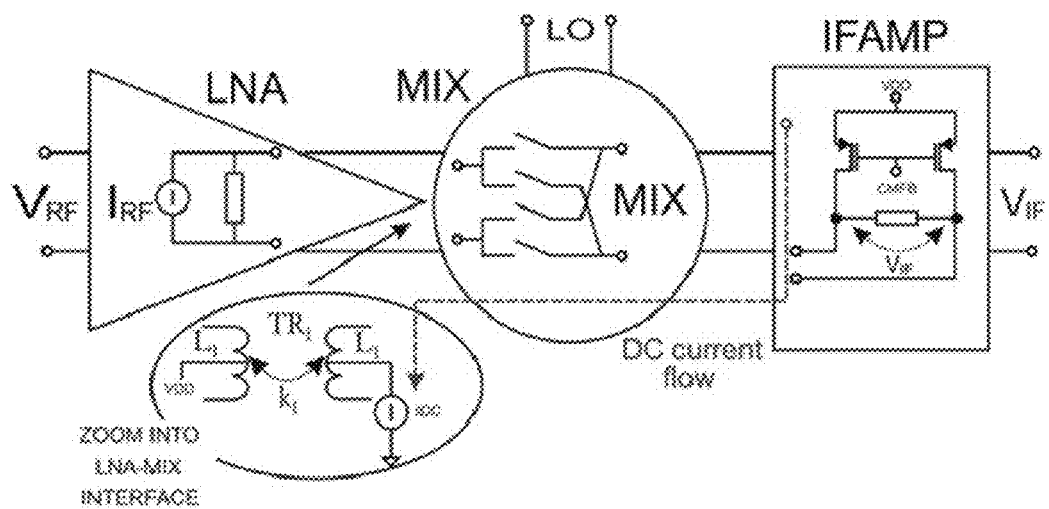
FIG. 3 illustrates a schematic of a current-commutating down-conversion mixer.

Further, considering the next block of the RF front-end, the down-conversion mixers (MIX), conventional architectures for mm-wave applications use current-commutating mixers, so called Gilbert-cell mixers. A block scheme of an RF front-end employing a current-commutating mixer is presented in FIG. 3. In this configuration the LNA acts as a current source pushing the current towards the switching stage in the mixer and IF amplifier (IFAMP) has to provide low input impedance in order to collect the current coming from the mixer. The drawback of this solution is that it is very difficult to realize good current source operating at about 60 GHz due to the fact that it is difficult to provide high output impedance at RF frequencies, which is an essential property of a current source. As a consequence, this solution suffers from high current losses, as a lot of current is lost flowing into the output impedance of the LNA.

Figure 4:
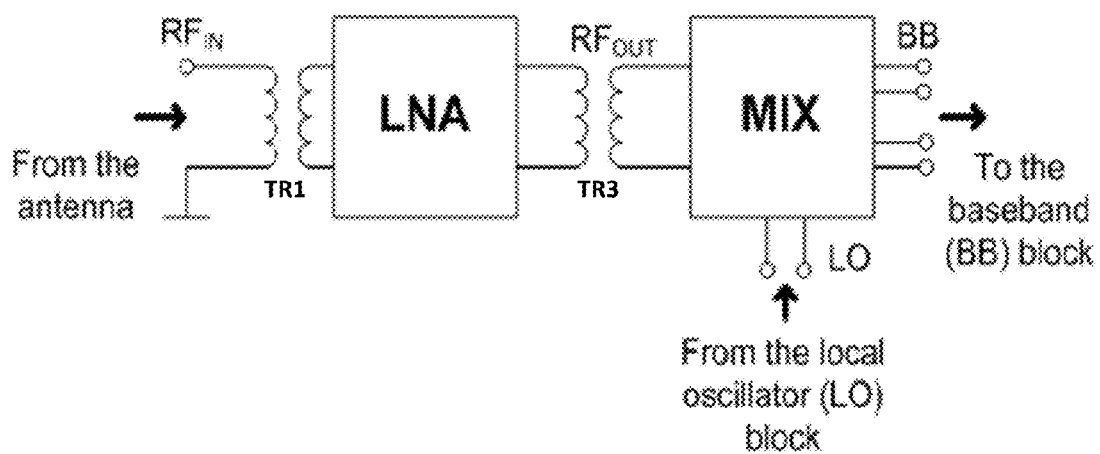
FIG. 4 illustrates a block diagram of the proposed RF front-end according to one embodiment of the present disclosure.

FIG. 4 shows a block diagram of the proposed RF front-end, comprising a low-noise amplifier (LNA) and a passive voltage-commutating mixer (MIX). The received radio signal is first amplified by the LNA, down-converted by the mixer (MIX) to baseband (BB) frequencies, by using a frequency tone provided by the local oscillator (LO) of the radio device. After down-converting, the signal is further processed in the baseband (BB) blocks. The LNA is inductively coupled via a transformer (TR1) to the antenna and via a second transformer (TR3) to the mixer. The input coupling via TR1 provides electrostatic discharge (ESD) protection, while the output coupling via TR3 provides direct connection to the mixer (MIX).

Figure 5:
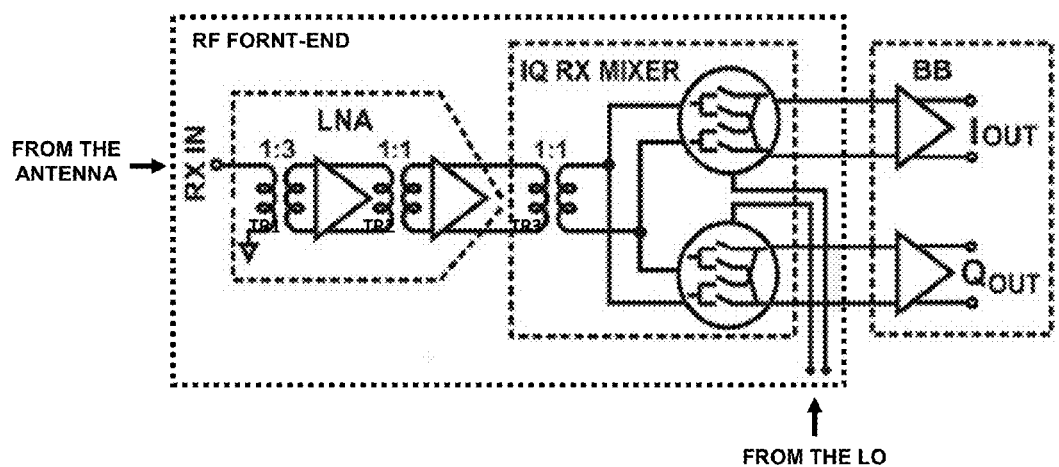
FIG. 5 illustrates a block diagram of a radio device comprising the proposed RF front-end according to the present disclosure.

In another embodiment the proposed low-noise amplifier may further comprise an additional amplification stage, for further amplifying the received input signal. This additional amplification stage is inductively coupled via an additional transformer (TR2). FIG. 5 shows a radio device comprising the proposed RF front-end system according to this embodiment.

In comparison to conventional approaches, in the present disclosure the LNA acts as a voltage source. In this case, the LNA provides low output impedance, which is much easier achieved at about 60 GHz, than providing high output impedance as required in order to have good current source. After commutation, the voltage is sensed by the BB amplifier, which has to provide high input impedance, which is relatively easy to do at low (baseband) frequencies.

Instead of using an inductively-degenerated common-source topology for the LNA, a differential transformer-coupled LNA is proposed in a preferred embodiment (FIG. 6), wherein the active part of the proposed LNA is a simple differential pair. To improve stability in the differential pair, a neutralization circuit, i.e. cross-coupled gate-drain neutralization capacitors, is used. For the first differential pair (LNA stage 1) the neutralization circuit is used in combination with a resistive shunt feedback. Additionally, the combination of the neutralization capacitors and a resistive shunt feedback allows simultaneous impedance and noise matching at the LNA input. This improves the noise figure (NF) of the LNA as well as the quality of the input-impedance matching (IIM). Due to the differential nature the immunity of this LNA to any common-mode disturbance (LO feed-through, substrate noise, supply ripple) is improved.

Further, a wideband input-impedance matching and a wideband response of the LNA are achieved, by designing the input transformer (TR1) with a turn ratio of about 1:3 and a coupling factor of about 0.5. In this way a wideband LNA response of more than about 10 GHz is ensured. At the same time, ESD protection at the LNA input is obtained without introducing any penalty on the LNA performance.

Figure 7:
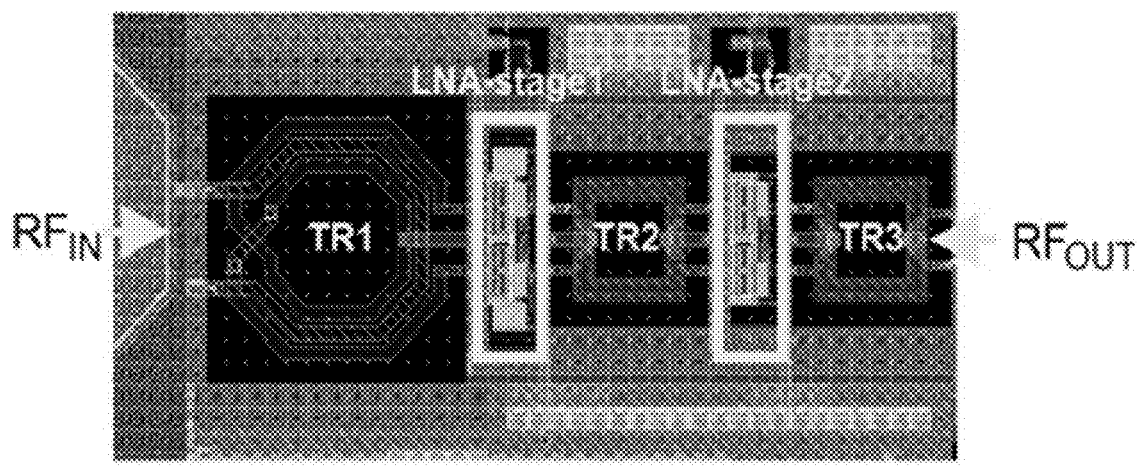
FIG. 7 illustrates the layout of the low-noise amplifier used in the proposed RF front-end.

The layout of the differential transformer-coupled LNA with neutralization and resistive shunt feedback as proposed in one embodiment of this invention is shown in FIG. 7. The layout of the LNA is compact and straightforward. The number of passive inductive elements is reduced by about 50% compared to the inductively-degenerated common-source amplifier as shown in FIG. 2(b). In the layout the borders between active and passive elements as well as the surrounding environment of the passive elements are very clear which allows good prediction of the behaviour of the passive elements and easy co-simulation. In addition, the mutual influence of the inductive elements is minimized since they are placed far from each other. In this way, it is possible to predict the behaviour of the passive elements very well. Finally, the input matching does not depend on the transconductance of the active part. In this way, certain orthogonality is introduced between LNA voltage gain and noise figure on one side and impedance matching on the other side. All this improves robustness of the LNA to process spread.

Figure 6:
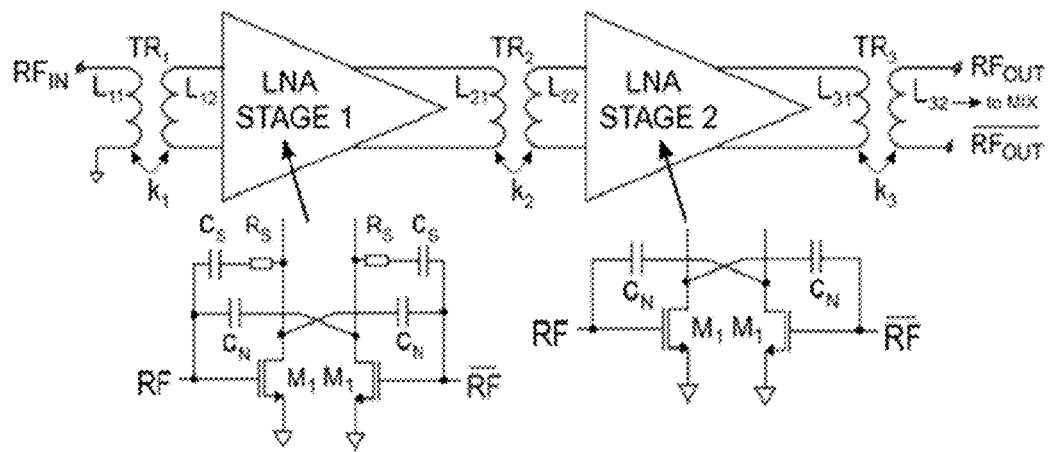
FIG. 6 illustrates a block diagram and schematics of the low-noise amplifier of the proposed RF front-end.
Figure 9:
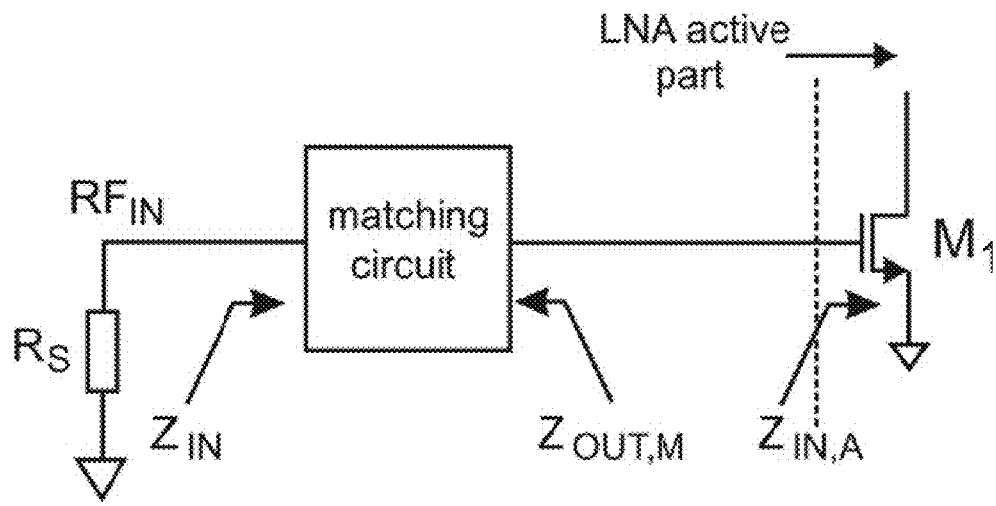
FIG. 9 illustrates the concept of impedance matching at the input of the low noise amplifier.

The embodiment of the LNA shown in FIG. 6 has a differential pair with neutralization implemented by using capacitor $C_N$ and resistive shunt feedback implemented via resistor $R_S$. The purpose of the capacitor $C_S$ is to DC decouple the LNA input from its output. The advantage of using a differential pair is in the improved robustness to common-mode disturbance, simplified layout and very low minimum noise figure ($NF_{min}$). Performed simulations with TSMC CMOS 40 nm technology show an $NF_{min}$ as low as about 2 dB is achievable. To use a differential pair in the LNA as an active element, two problems have been solved. First, stability has to be ensured as well as simultaneous input impedance and noise matching. For explaining the conditions to be satisfied for providing simultaneous input impedance and noise matching FIG. 9 is used. To provide impedance matching at the input the following equation has to be satisfied:

$$R_S = Z_{IN} \qquad (1)$$

$R_S$ is the source impedance and $Z_{IN}$ is the input impedance of the LNA. $R_S$ is usually equal to about 50Ω. If Equation (1) is satisfied then the following holds $$Z_{OUT,M} = Z^*_{IN,A} \qquad (2)$$

$Z_{OUT,M}$ is the output impedance of the matching network, and $Z_{IN,A}$ is the input impedance of active part of the LNA. If $Z_{NM}$ is the required driving impedance for which minimum noise figure is achieved, then in order to achieve simultaneous input impedance matching and noise matching the following equation has to be satisfied:

$$Z_{OUT,M} = Z_{NM} \qquad (3)$$

By combining equations (2) and (3) the final condition for simultaneous input impedance matching and noise matching is obtained:

$$Z_{NM} = Z^*_{IN,A} \quad (4)$$

The input impedance of the active part can be approximated by:

$$Z_{IN,A} = R_g + \frac{1}{j\omega C_{gs}} \quad (5)$$

where $R_g$ is the gate resistance of the transistor $M_1$, while $C_{gs}$ is gate-source and gate-drain parasitic capacitances of the transistor $M_1$. Considering noise matching, it can be calculated that the required driving impedance can be expressed as:

$$Z_{NM} = 2\sqrt{\frac{R_g}{\gamma g_m}} + \frac{j}{\omega C_{gs}} \quad (6)$$

where $g_m$ is the transconductance of the transistor $M_1$ and $\gamma$ is a constant approximately equal to 1. Based on equation (4), the real and imaginary parts of $Z_{IN,A}$ and $Z_{NM}$ should be about equal. Their imaginary parts will be about equal when $C_{gd}$ is about zero, and this is exactly what neutralization does by choosing $C_N = \sim C_{gd}$. This effect is also confirmed by simulations. In Table 1 simulated values for $Z_{IN,A}$ and $Z_{NM}$ for the differential pair with and without neutralization are shown. It is clear that neutralization contributes to the simultaneous impedance and noise matching because $\text{Im}\{Z_{NM}\} = \text{Im}\{Z^*_{IN,A}\}$. Another positive effect of the neutralization is stability improvement. $C_{gd}$ deteriorates reverse isolation and by neutralizing $C_{gd}$ a unilateral and stable LNA is obtained. The application of neutralization for stability improvement is known in the literature, but positive influence on simultaneous input impedance matching and noise matching has not been reported in the literature so far.

| | | |
|---|---|---|
| without neutralization | $Z_{IN,A}^* = 2 + j62$ | $Z_{NM} = 44 + j49$ |
| with neutralization | $Z_{IN,A}^* = 7.5 + j80$ | $Z_{NM} = 19 + j82$ |

Figure 10:
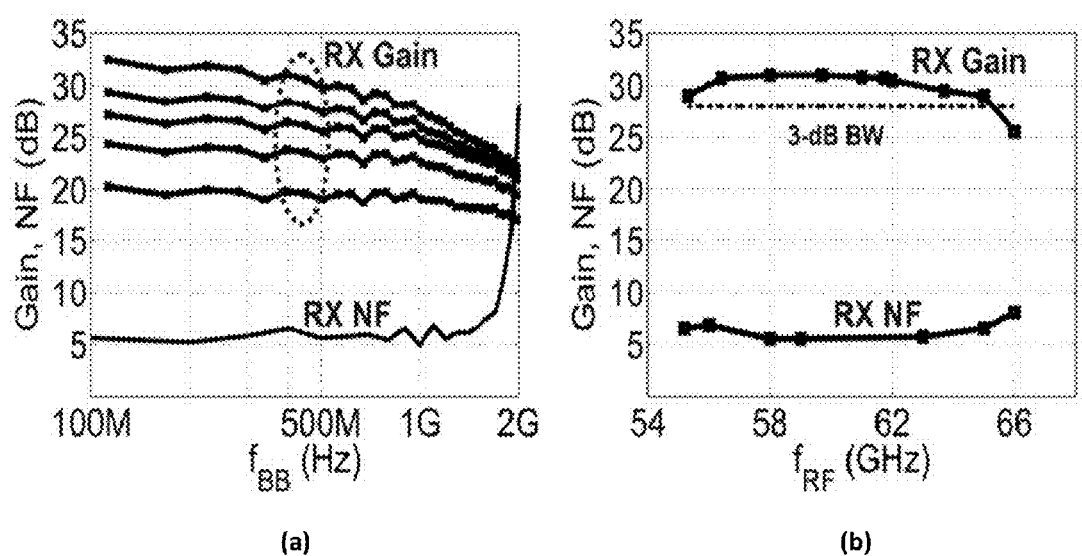
FIG. 10 illustrates the dependency of the real part of the input impedance of the active part and driving impedance required for the noise matching on the resistor value used in shunt feedback.

Table 1: Simulated input impedance and driving impedance required for noise matching for differential pair with and without neutralization Although neutralization ensures that $\text{Im}\{Z_{NM}\} = \sim \text{Im}\{Z^*_{IN,A}\}$, there is still a difference between $\text{Re}\{Z_{NM}\}$ and $\text{Re}\{Z^*_{IN,A}\}$. Actually, the question is how to increase the real part of the input impedance of the active part in the LNA. One way is to degenerate the transistor $M_1$ with an inductor. This solution, however, is not good from layout compactness point of view, as it is a step back towards inductively-degenerated common-source LNA. To avoid the use of an additional inductor, in the present disclosure a resistive shunt feedback, a cross-coupled $R_s$ and $C_s$ as shown in FIG. 6, is used. In FIG. 10 dependence is shown of the real parts of the input impedance of the active part and driving impedance required for the noise matching on the resistor value used in shunt feedback. It is clear that by reducing $R_S$, the difference between $\text{Re}\{Z_{NM}\}$ and $\text{Re}\{Z^*_{IN,A}\}$ can be made very small, allowing simultaneous input impedance matching and noise matching, which as a consequence minimizes the noise figure of the LNA.

Figure 11:
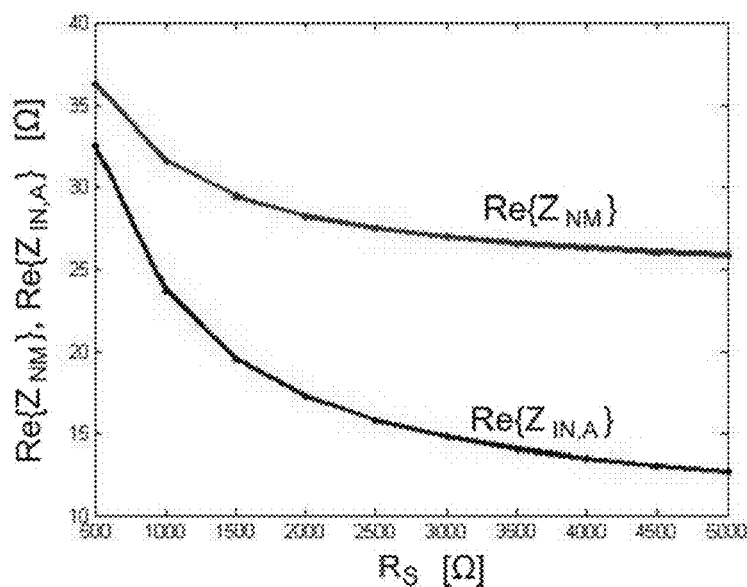
FIG. 11 illustrates the quality of the input matching (expressed via S11) of the low noise amplifier as a function of the resistor in the shunt feedback and the capacitor in the shunt feedback.
Figure 12:
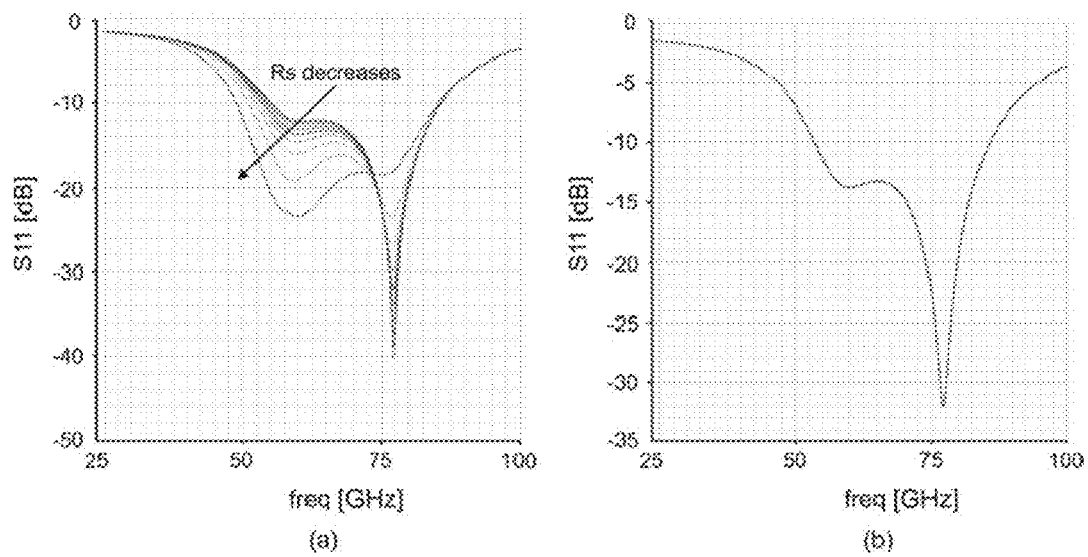
FIG. 12 illustrates gain and noise figure with respect to baseband and RF frequencies.

Another advantage of using resistive shunt feedback is the quality improvement of the LNA input matching. FIG. 11(a) and FIG. 11(b) shows the quality of the input matching of the LNA (expressed via the parameter $S_{11}$) as a function of $R_S$ and $C_S$, respectively. It is clear that matching improves (lower than −10 dB) by decreasing $R_S$. $S_{11}$ is better than about −10 dB in a very wide frequency range from about 50 GHz up to about 80 GHz. It is interesting and also beneficial that $S_{11}$ does not depend on $C_S$, which can be chosen to be small in order not to deteriorate layout compactness. Finally, the resistive shunt feedback improves stability in case of process spread. Then the neutralization capacitor $C_N$ will not be able to exactly compensate $C_{gd}$ and stability will be deteriorated. But, fortunately, the resistive shunt feedback partially compensate mismatch between $C_N$ and $C_{gd}$ and in this way improves robustness to process spread.

By using the input transformer with a turn ratio of about 1:3 and a coupling factor of about 0.5, the wideband input-impedance matching and the wideband response of the LNA are achieved. At the same time the ESD protection is obtained at the input without introducing any penalty on the LNA performance. The simulated RF bandwidth of the LNA is as wide as about 10 GHz. The layout of the LNA is compact and straightforward. The number of passive inductive elements is reduced for about 50% compared to inductively-degenerated common-source amplifier. In the layout the borders between active and passive elements are clearly defined and mutual influence of the transformers is minimized. In this way it is possible to predict the behaviour of the passive elements very well. Wideband nature of the LNA and good prediction of the behaviour of passive elements contribute a lot to the robustness of the proposed LNA.

Finally, the input matching of the LNA depends on parasitic gate-source capacitance of the input transistor in the LNA, which is mainly determined by the transistor geometry. The transconductance of the input transistor does not play a role in the input matching any more. Therefore, a certain orthogonality is introduced between LNA voltage gain and noise figure on one side and impedance matching on the other side. This is very important for the LNA robustness to the process spread. By performing process spread, $S_{11}$ stays better than about −10 dB in the frequency range from about 57 GHz up to about 64 GHz, which is the frequency range of interest.

Figure 8:
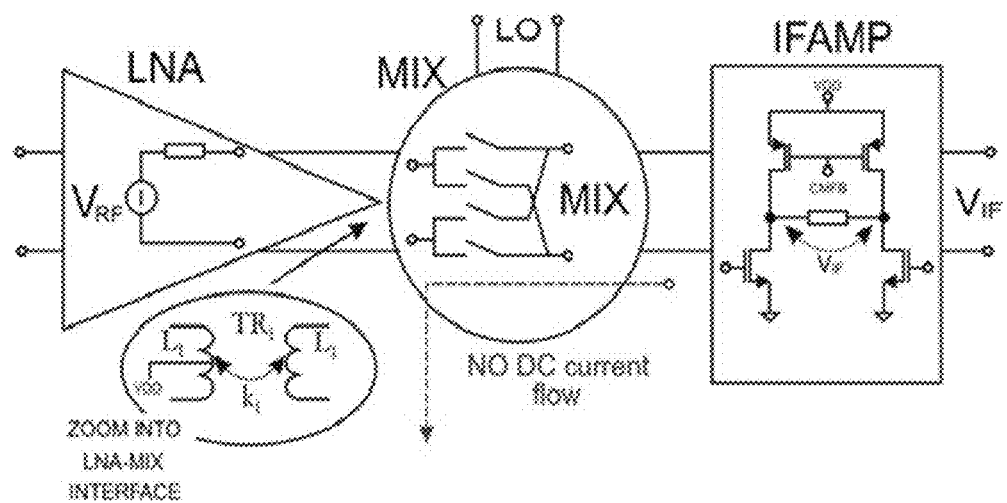
FIG. 8 illustrates an example of a voltage-commutating down-conversion mixer.

In another embodiment, the proposed RF front-end system uses a passive mixer (e.g. a voltage-commutating mixer) instead of current-commutating mixer (active mixer) for down-converting the amplified radio signal to baseband frequency (FIG. 8). At radio frequencies, e.g. about 60 GHz, it is easier to realize low impedance than high impedance, while at low frequencies it is not an issue. Therefore, for a RF front-end operating at about 60 GHz it is more beneficial to use voltage-commutating mixer. In this case the LNA has to act as a voltage source with a low output impedance and the IF amplifier (IFAMP) has to provide a high impedance in order to sense the voltage at the mixer output. In a current-commutating down-conversion mixer the LNA has to work as a current source requiring high output impedance. Since this is difficult to realize at about 60 GHz, a lot of current provided by the LNA flows into his output impedance. This portion of the current is lost. Hence, a voltage-commutating mixer can provide substantially larger voltage gain than the current-commutating equivalent. As shown in FIG. 8, the centre tap of the transformer TR1 on the mixer side is left open. This means there is no DC current flowing through the switches in the mixer. The advantage of having no DC current through the mixer switches is reduction of the flicker noise. The use of a passive voltage commutating mixer yields a high voltage gain and reliable operation with low LO amplitudes.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A front-end system for a radio device comprising:
   a low-noise amplifier arranged for receiving an input signal and for outputting an amplified signal and comprising a first amplification stage and a second amplification stage, wherein the first amplification stage comprises a resistive shunt feedback circuit that includes a capacitor in series with a resistor, the capacitor providing DC decoupling of the low-noise amplifier; and
   a mixer arranged for down-converting the amplified signal provided by the low-noise amplifier to a baseband signal by multiplying the amplified signal with a local oscillator frequency tone, wherein the low-noise amplifier and the mixer are transformer-coupled.

2. The front-end system of claim 1, wherein the low-noise amplifier includes a neutralization circuit comprising a cross-coupled capacitor.

3. The front-end system of claim 1, wherein the second amplification stage is inductively coupled to the first amplification stage.

4. The front-end system of claim 1, wherein the low-noise amplifier is inductively coupled to an antenna.

5. The front-end system of claim 1, further comprising, at an input of the low-noise amplifier, an input transformer with a turn ratio of about 1:3 and coupling factor of about 0.5.

6. The front-end system of claim 1, wherein the mixer is a passive voltage switching mixer.

7. The front-end system of claim 1, wherein the mixer is implemented differentially.

8. A radio device comprising a front-end system, wherein the front end system includes:
   a low-noise amplifier arranged for receiving an input signal and for outputting an amplified signal and comprising a first amplification stage and a second amplification stage, wherein the first amplification stage comprises a resistive shunt feedback circuit that includes a capacitor in series with a resistor, the capacitor providing DC decoupling of the low-noise amplifier; and
   a mixer arranged for down-converting the amplified signal provided by the low-noise amplifier to a baseband signal by multiplying the amplified signal with a local oscillator frequency tone, wherein the low-noise amplifier and the mixer are transformer-coupled.

9. The radio device of claim 8, wherein the low-noise amplifier includes a neutralization circuit comprising a cross-coupled capacitor.

10. The radio device of claim 8, wherein the second amplification stage is inductively coupled to the first amplification stage.

11. The radio device of claim 8, wherein the low-noise amplifier is inductively coupled to an antenna.

12. The radio device of claim 8, further comprising, at an input of the low-noise amplifier, an input transformer with a turn ratio of about 1:3 and coupling factor of about 0.5.

13. The radio device of claim 8, wherein the mixer is a passive voltage switching mixer.

14. The radio device of claim 8, wherein the mixer is implemented differentially.

15. A differential low-noise amplifier comprising:
   a first amplification stage and a second amplification stage,
   wherein the first amplification stage comprises a resistive shunt feedback circuit that includes a capacitor in series with a resistor, the capacitor providing DC decoupling of the differential low-noise amplifier,
   wherein the first amplification stage further comprises a neutralization circuit that includes a cross-coupled capacitor, and
   wherein the differential low-noise amplifier is adapted for use in a front-end system of a radio device.

16. The differential low-noise amplifier of claim 15, wherein the first amplification stage is inductively coupled to the second amplification stage.

17. The differential low-noise amplifier of claim 15, wherein the differential low-noise amplifier is configured to inductively receive an input signal from an antenna.

18. The differential low-noise amplifier of claim 15, further comprising an input transformer with a turn ratio of about 1:3 and a coupling factor of about 0.5.

* * * * *